(12) United States Patent
Ishikawa

(10) Patent No.: US 6,193,143 B1
(45) Date of Patent: Feb. 27, 2001

(54) SOLDER BUMP FORMING METHOD AND MOUNTING APPARATUS AND MOUNTING METHOD OF SOLDER BALL

(75) Inventor: Takatoshi Ishikawa, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/366,194

(22) Filed: Aug. 4, 1999

(30) Foreign Application Priority Data

Aug. 5, 1998 (JP) .................................................. 10-221370
Aug. 5, 1998 (JP) .................................................. 10-221371

(51) Int. Cl.[7] ............................. B23K 31/02; B23K 1/20
(52) U.S. Cl. .......................... 228/245; 228/223; 228/253; 228/180.22
(58) Field of Search ................................ 228/123.1, 245, 228/180.22, 180.21, 253, 19, 207, 223; 438/613; 257/737, 738

(56) References Cited

U.S. PATENT DOCUMENTS

| 4,462,534 | * | 7/1984 | Bitaillou et al. . |
| 5,439,162 | * | 8/1995 | George et al. . |
| 5,626,277 | * | 5/1997 | Kawada . |
| 5,762,259 | * | 6/1998 | Hubacher et al. . |
| 5,816,481 | * | 10/1998 | Economy et al. . |

* cited by examiner

Primary Examiner—Patrick Ryan
Assistant Examiner—Jonathan Johnson
(74) Attorney, Agent, or Firm—Wenderoth, Lind & Ponack, L.L.P.

(57) ABSTRACT

To present a method and apparatus for forming favorable solder bumps on a substrate of electronic component or the like, in which metal paste is applied on the lower surface of solder balls attracted by a suction tool, and the solder balls are positioned to contact with recesses having the electrode in the bottom, so that the metal paste adhered to the solder balls is adhered to the top of the recesses. Next, the solder balls are moved reciprocally in the vertical direction or horizontal direction. As a result, the metal paste adhered to the top of the recesses is collected to fill up the recesses. Then, the solder balls are put on the top of the recesses, and heated and fused, and solder bumps are formed.

16 Claims, 11 Drawing Sheets

(a)

(b)

SOLDER BUMP FORMING METHOD AND MOUNTING APPARATUS AND MOUNTING METHOD OF SOLDER BALL

FIELD OF THE INVENTION

The present invention relates to a solder bump forming method for forming a solder bump by mounting a solder ball on an electrode, and a mounting apparatus and mounting method of solder ball.

BACKGROUND OF THE INVENTION

As a method of forming a solder bump on an electronic component, substrate or the like (hereinafter called a work), a method of using a solder ball is known. This method is to mount a solder ball on an electrode of a work, and heat to fuse the solder ball, thereby bonding the solder to the electrode. At the junction of the solder ball and electrode, in order to improve the bonding performance, a solder paste containing solder particles in the flux is applied. At this time, the methods of application include a method of applying a solder paste to the lower end of the solder ball preliminarily, and a method of transferring the solder paste by using a pin and applying on the electrode surface.

Depending on the type of the electronic component, a solder bump may be formed on a recess provided in an insulating layer covering the electrode such as TAB tape. In such a case, since the solder ball for forming a bump must be bonded with solder so as to be in conductive state with the electrode formed in the bottom of the recess, the solder paste must be applied in the inside of the recess.

However, since the solder paste is an adhesive paste material, it is not easy to fill in the recess uniformly. In particular, in the higher density trend of electronic components, since the aperture of recess is smaller than the diameter of the solder ball or the size of the transfer pin, it is more difficult to fill the recess with solder paste.

Sufficient filling with solder paste may be realized by a method of filling the recess with solder paste by printing by using a stencil mask, but this method requires a solder paste printing device, and the equipment cost is increased and the process is complicated, and it is hence not preferred. If attempted to bond with solder while filling with solder paste is insufficient, bonding with the electrode surface is defective, and a favorable solder bump is not formed.

SUMMARY OF THE INVENTION

It is hence an object of the invention to present a forming method of solder bump, and a mounting apparatus and a mounting method of solder ball, capable of filling with metal paste favorably without using exclusive metal paste printing device or the like, and forming a solder bump of high quality.

In the invention, a metal paste is applied on the solder ball lower side when putting the solder ball on the recess for forming a solder bump on the electrode in the bottom of the recess formed in the work, and by positioning this solder ball in the recess, the metal paste adhered to the solder ball is adhered to the top of the recess. Next, to fill the recess with the metal paste, for example, the solder ball is moved in the vertical direction to the recess, or moved in the horizontal direction, or moved in the combined motion. As a result, the metal paste adhered to the top of the recess can be pushed into the recess, so that the metal paste may be applied favorably.

A forming method of solder bump in a first aspect of the invention is a forming method of solder bump for forming a solder bump on the electrode in the bottom of a recess formed in a work, comprising a first step of adhering a metal paste to the lower side of a solder ball, a second step of adhering the metal paste adhered to the solder ball to the top of the recess by positioning the solder ball to the recess, a third step of performing at least one stroke of motion of moving the solder ball once away from the recess and bringing closer again, and a step of mounting the solder ball on the recess filled with the metal paste and heating to fuse the solder ball.

A forming method of solder bump in a second aspect of the invention relates to the forming method of solder bump in the first aspect of the invention, in which the third step includes a motion of moving the solder ball in the vertical direction to the work surface.

A forming method of solder bump in a third aspect of the invention relates to the forming method of solder bump in the first aspect of the invention, in which the third step includes a motion of moving the solder ball in the horizontal direction to the work surface.

A forming method of solder bump in a fourth aspect of the invention relates to the forming method of solder bump in the first aspect of the invention, in which the third step includes a motion of once moving the solder ball above the work surface, and then lowering to a position slightly remote from the center of the recess.

A forming method of solder bump in a fifth aspect of the invention is a forming method of solder bump for forming a solder bump on the electrode in the bottom of a recess formed in a work, comprising a first step of adhering a metal paste to the lower end of a pin by using a transfer pin, a second step of adhering the metal paste adhered to the transfer pin to the top of the recess by positioning the transfer pin at the recess, a third step of performing at least one stroke of motion of moving the transfer pin once away from the recess and bringing closer again, a step of mounting a solder ball on the recess filled with the metal paste, and a step of fusing the solder ball.

A forming method of solder bump in a sixth aspect of the invention relates to the forming method of solder bump in the fifth aspect of the invention, in which the third step includes a motion of moving the transfer pin in the vertical direction to the work surface.

A forming method of solder bump in a seventh aspect of the invention relates to the forming method of solder bump in the fifth aspect of the invention, in which the third step includes a motion of moving the transfer pin in the horizontal direction to the work surface.

A forming method of solder bump in an eighth aspect of the invention relates to the forming method of solder bump in the fifth aspect of the invention, in which the third step includes a motion of once moving transfer pin above the work surface, and then lowering to a position slightly remote from the center of the recess.

A forming method of solder bump in a ninth aspect of the invention is a forming method of solder bump for forming a solder bump on the electrode in the bottom of a recess formed in a work, comprising a first step of adhering a metal paste to the lower end of a transfer pin having the lower end of a smaller size than the opening size of the recess, a second step of adhering the metal paste adhered to the transfer pin to the electrode in the bottom of the recess by positioning the transfer pin in the recess, a fourth step of mounting a solder ball on the recess filled with the metal paste, and a fifth step of fusing the solder ball or metal paste.

A mounting apparatus of solder ball in a tenth aspect of the invention is for forming a solder bump on the electrode in the bottom of a recess formed in a work, being a mounting apparatus of solder ball for mounting a solder ball of a larger size than the opening size of this recess on the recess, comprising a work holder for holding the work with the recess forming side upward, a solder ball feeder for feeding the solder ball, a suction head for sucking and holding the solder ball in the solder ball feeder, a metal paste feeder having a device for straightening the liquid level of metal paste flat, suction head moving means for moving the suction head to suck the solder ball from the solder ball feeder, adhere the metal paste of the metal paste feeder to the lower side of the solder ball, and mount the solder ball coated with the metal paste on the recess of the work held in the work holder, and a controller for controlling the suction head moving means to perform at least one stroke of the motion of once moving the solder ball away from the recess in the mounting motion, and bringing closer again.

A mounting method of solder ball in an eleventh aspect of the invention is for forming a solder bump on the electrode in the bottom of a recess formed in a work, being a mounting method of solder ball for mounting a solder ball of a larger size than the opening size of this recess on the recess, comprising a first step of applying a metal paste to the lower side of a solder ball, a second step of adhering the metal paste adhered to the solder ball to the top of the recess by positioning the solder ball at the recess, and a third step of performing at least one stroke of motion of moving the solder ball once away from the recess and bringing closer again.

A mounting method of solder ball in a twelfth aspect of the invention relates to the mounting method of solder ball in the eleventh aspect of the invention, in which the third step includes a motion of moving the solder ball in the vertical direction to the work surface.

A mounting method of solder ball in a thirteenth aspect of the invention relates to the mounting method of solder ball in the eleventh aspect of the invention, in which the third step includes a motion of moving the solder ball in the horizontal direction to the work surface.

A mounting method of solder ball in a fourteenth aspect of the invention relates to the mounting method of solder ball in the eleventh aspect of the invention, in which the third step includes a motion of once moving the solder ball above the work surface, and then lowering to a position slightly remote from the center of the recess.

A mounting apparatus of solder ball in a fifteenth aspect of the invention is for forming a solder bump on the electrode in the bottom of a recess formed in a work, being a mounting apparatus of solder ball for mounting a solder ball of a larger size than the opening size of this recess on the recess, comprising a work holder for holding the work with the recess forming side upward, a solder ball feeder for feeding the solder ball, a suction head for sucking and holding the solder ball in the solder ball feeder and mounting on the recess, a metal paste feeder having a device for straightening the liquid level of metal paste flat, a transfer head including a plurality of transfer pins having the lower end of a larger size than the opening size of the recess for adhering the metal paste to this lower end, transfer head moving means for moving the transfer head to adhere the metal paste of the metal paste feeder to the recess of a substrate held in the work holder, and a controller for controlling the transfer head moving means to perform at least one stroke of the motion of once moving the transfer pins away from the recess in the adhering motion, and bringing closer again.

A mounting method of solder ball in a sixteenth aspect of the invention is for forming a solder bump on the electrode in the bottom of a recess formed in a work, being a mounting method of solder ball for mounting a solder ball of a larger size than the opening size of this recess on the recess, comprising a first step of adhering a metal paste to the lower side of a transfer pin having the lower end of a larger size than the opening size of the recess, a second step of adhering the metal paste adhered to the transfer pin to the top of the recess by positioning the transfer pin at the recess of the work, a third step of performing at least one stroke of motion of moving the transfer pin once away from the recess and bringing closer again, and a step of mounting the solder ball on the recess filled with the metal paste.

A mounting method of solder ball in a seventeenth aspect of the invention relates to the mounting method of solder ball in the sixteenth aspect of the invention, in which the third step includes a motion of moving the transfer pin in the vertical direction to the work surface.

A mounting method of solder ball in an eighteenth aspect of the invention relates to the mounting method of solder ball in the sixteenth aspect of the invention, in which the third step includes a motion of moving the transfer pin in the horizontal direction to the work surface.

A mounting method of solder ball in a nineteenth aspect of the invention relates to the mounting method of solder ball in the sixteenth aspect of the invention, in which the third step includes a motion of once moving the transfer pin above the work surface, and then lowering to a position slightly remote from the center of the recess.

A mounting apparatus of solder ball in a twentieth aspect of the invention is for forming a solder bump on the electrode in the bottom of a recess formed in a work, being a mounting apparatus of solder ball for mounting a solder ball of a larger size than the opening size of this recess on the recess, comprising a work holder for holding the work with the recess forming side upward, a solder ball feeder for feeding the solder ball, a metal paste feeder having a device for straightening the liquid level of metal paste flat, a transfer head including a plurality of transfer pins having the lower end of a smaller size than the opening size of the recess for adhering the metal paste to this lower end and transferring to the electrode, and a suction head for sucking and holding the solder ball in the solder ball feeder and mounting on the recess having the electrode on which the metal paste is transferred.

A mounting method of solder ball in a twenty-first aspect of the invention is for forming a solder bump on the electrode in the bottom of a recess formed in a work, being a mounting method of solder ball for mounting a solder ball of a larger size than the opening size of this recess on the recess, comprising a step of adhering a metal paste to the lower side of a transfer pin having the lower end of a smaller size than the opening size of the recess, a step of transferring the metal paste adhered to the transfer pin to the electrode in the bottom of the recess by positioning the transfer pin in the recess of the work, and a step of mounting the solder ball in the solder ball feeder on the recess having the electrode on which the metal paste is transferred by sucking and holding by a suction head.

Thus, according to the first to eighth and tenth to nineteenth aspects of the invention, by performing at least one stroke of motion of once moving the solder ball or transfer pin away from the recess and bringing closer again, or according to the ninth, twentieth and twenty-first aspect of the invention, by using the transfer pin having the lower end of a smaller size than the opening size of the recess, the recess can be sufficiently filled with metal paste.

That is, in the invention, as the method of filling the recess with metal paste, by transferring by using the solder ball or transfer pin, it is intended to fill the recess with the metal paste sufficiently by the operation of at least one stroke of motion of moving the solder ball or transfer pin away from the recess and bringing closer again, or by using the transfer pin having the lower end of a smaller size than the opening size of the recess, the recess is filled with the metal paste sufficiently, and therefore without requiring any particular step for feeding the metal paste, the solder bump having an excellent shape and strength can be formed efficiently.

Figure 1:
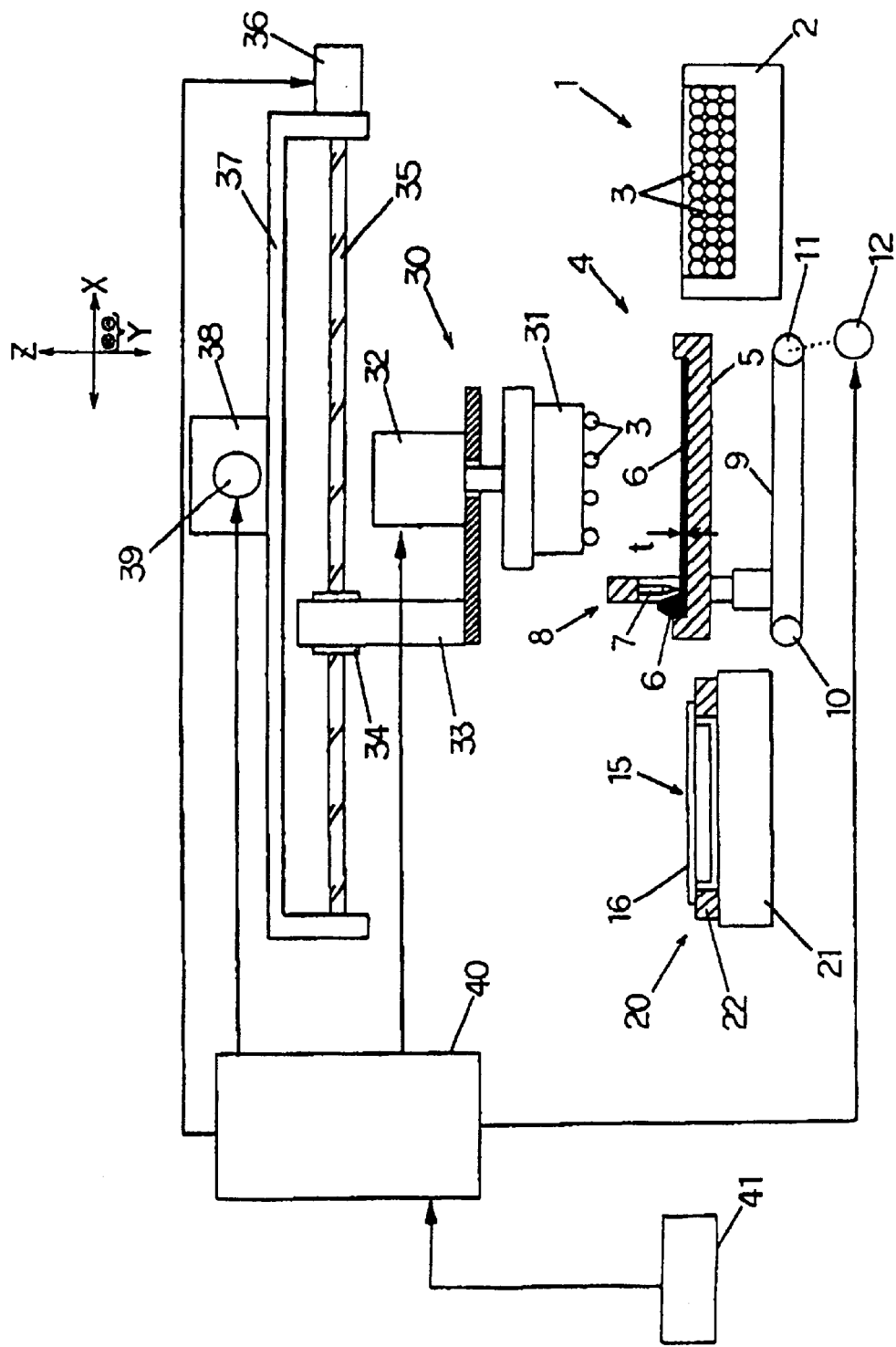
FIG. 1 is a front view of a mounting apparatus of solder ball in embodiment 1 of the invention.

Reference Numerals
1 Solder ball feeder
2 Container
3 Solder ball
3' Solder bump
4 Metal paste feeder
5 Container
6 Metal paste
7 Squeegee
8 Squeegee unit
9 Belt
10 Pulley
11 Pulley
12 Motor
15 Electronic component
16 Substrate
16a Recess
17 Electrode
18 Semiconductor element
18a Wire
19 Resin layer
20 Holder
21 Holding table
22 Holder element
30 Suction head
31 Suction tool
32 Elevating mechanism
33 Bracket
34 Nut
35 Feed screw
36 X-axis motor
37 Frame
38 Y-axis table
39 Y-axis motor
40 Controller
41 Setting device
42 Transfer head
43 Transfer tool
44 Transfer pin
44a Transfer pin lower end
45 Transfer pin
45a Transfer pin lower end
46 Elevating mechanism
t Thickness of metal paste shaped by squeegee

DESCRIPTION OF THE PREFERRED EMBODIMENTS

Embodiment 1

Figure 3:
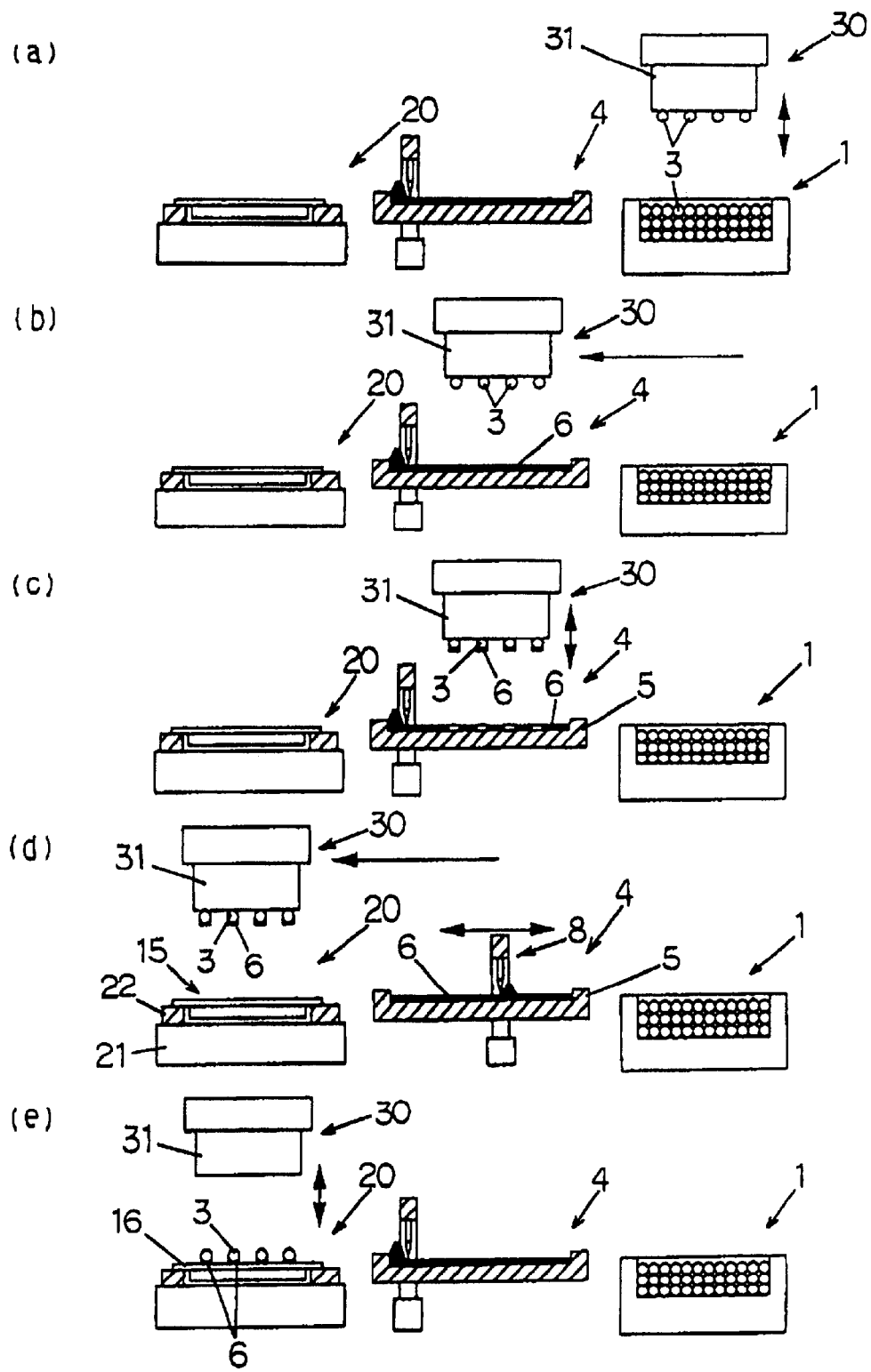
FIGS. 3(a), (b), (c), (d), and (e) are process explanatory diagrams of mounting method of solder ball in embodiment 1 of the invention.
Figure 4:
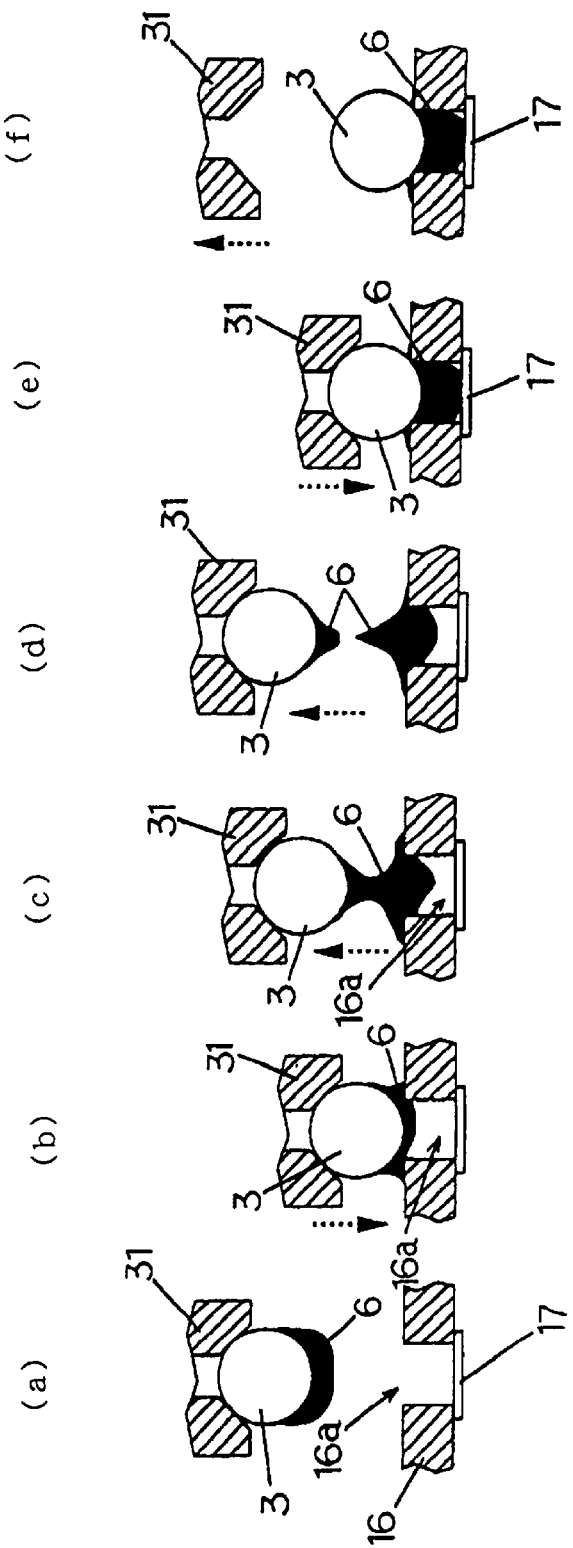
FIGS. 4(a), (b), (c), (d), (e) and (f) are explanatory diagrams of mounting operation of solder ball in embodiment 1 of the invention.
Figure 5:
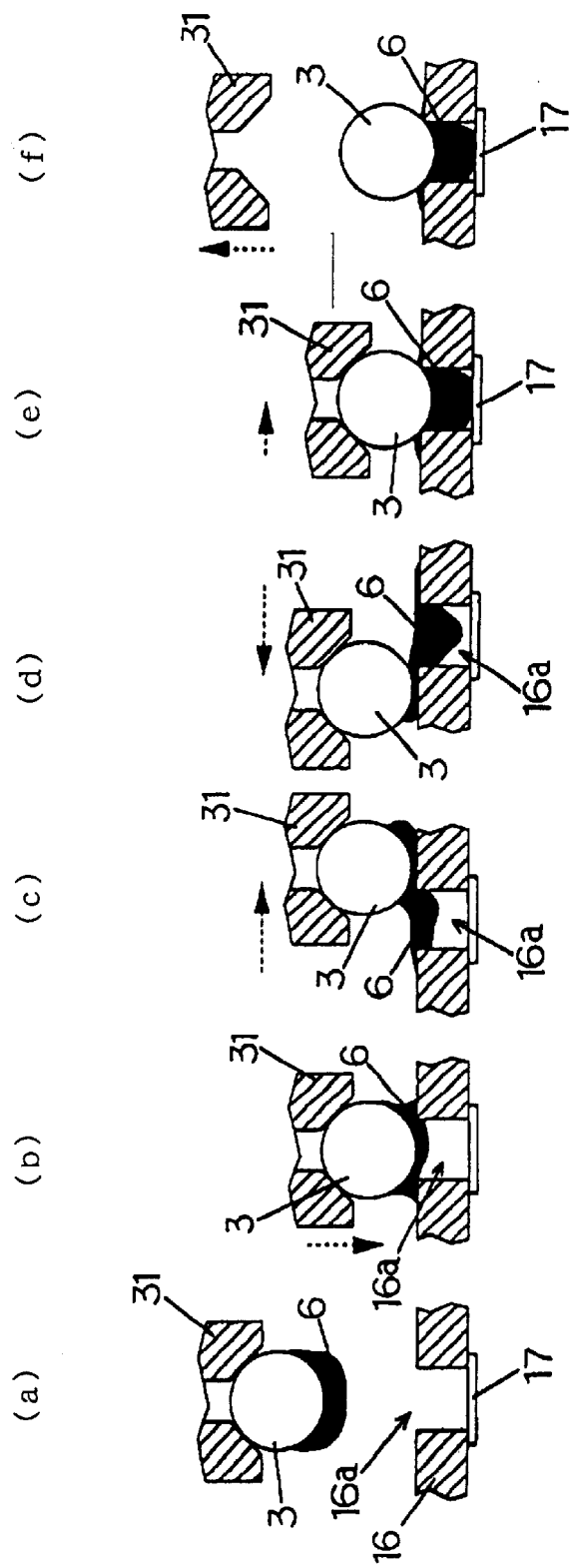
FIGS. 5(a), (b), (c), (d), (e) and (f) are explanatory diagrams of mounting operation of solder ball in embodiment 1 of the invention.
Figure 6:
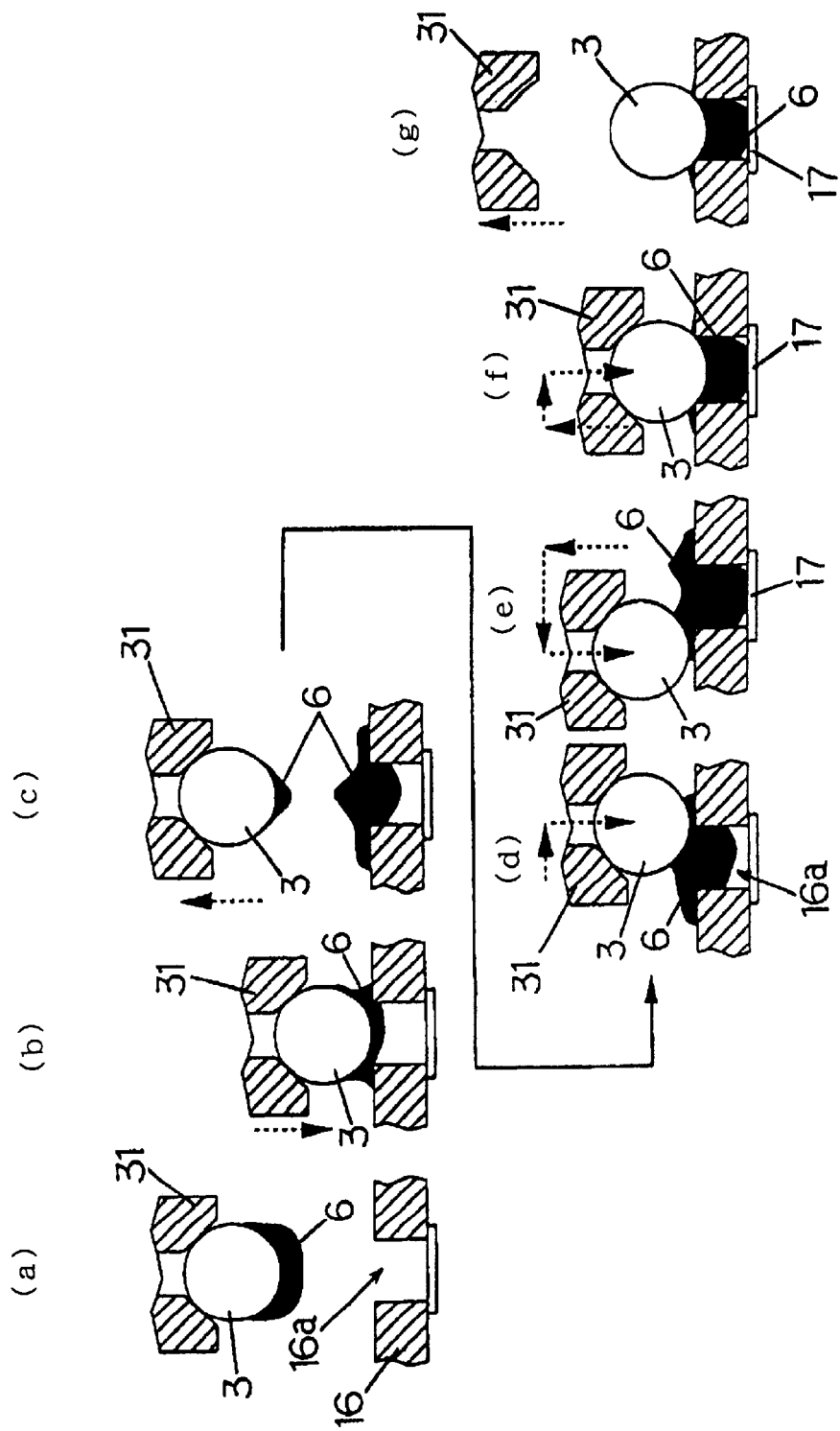
FIGS. 6(a), (b), (c), (d), (e), (f) and (g) are explanatory diagrams of mounting operation of solder ball in embodiment 1 of the invention.

FIG. 1 is a front view of a mounting apparatus of solder ball in embodiment 1 of the invention, FIG. 2(a) is a sectional view of an electronic component, FIG. 2(b) is a magnified sectional view of a solder bump, FIG. 3(a), (b), (c), (d), and (e) are process explanatory diagrams of mounting method of solder ball, and FIG. 4, FIG. 5 and FIG. 6 are explanatory diagrams of mounting operation of solder ball.

Referring first to FIG. 1, the structure of mounting apparatus of solder ball is described. In FIG. 1, multiple solder balls 3 are stored in a container 2 of a solder ball feeder 1. A metal paste feeder 4 is disposed beside the solder ball feeder 1. The metal paste feeder 4 has a container 5 with a flat bottom, and metal paste 6 is applied in the bottom of the container 5. The container 5 has a squeegee unit 8 having a squeegee 7, and the squeegee unit 8 is coupled to a belt 9 stretched between pulleys 10 and 11. By rotating and driving the pulley 11 by driving a motor 12, the squeegee unit 8 moves horizontally, and the squeegee 7 straightens the metal paste 6 flat on the bottom of the container 5 by this horizontal move. As a result, the metal paste 6 is applied in a uniform thickness on the bottom of the container 5. Herein, the metal paste 6 is flux or resin containing conductive particles of solder, gold, silver, aluminum or the like.

Figure 2:
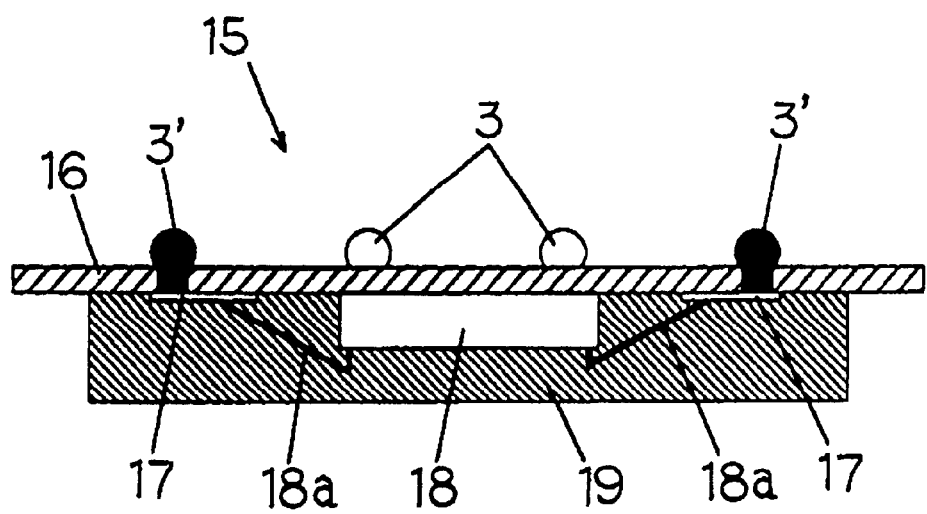
FIG. 2(a) is a sectional view of an electronic component in embodiment 1 of the invention.
FIG. 2(b) is a magnified sectional view of a solder bump in embodiment 1 of the invention.
Figure 2:
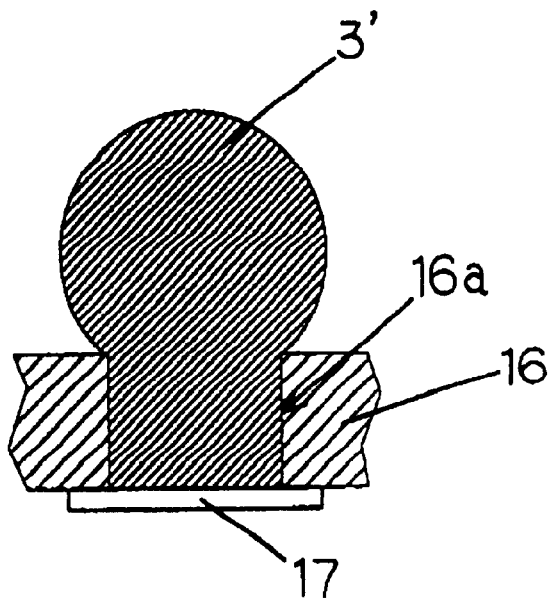

Beside the metal paste feeder 4, a work holder 20 is disposed. The work holder 20 has a holding table 21, and an electronic component 15 is held as a work in a holder element 22 of the holding table 21. Referring now to FIG. 2, the electronic component 15 is described below.

As shown in FIG. 2(a), the electronic component 15 is composed by mounting a semiconductor element 18 on a substrate 16 made of polyimide or glass epoxy (FR-4), and sealing with a resin layer 19. At the lower side of the substrate 16, there is an electrode 17 connected to the semiconductor element 18 through a wire 18a, and a penetration hole 16a is provided at the position of the electrode 17. The penetration hole 16a is a concave part formed in the substrate 16 (hereinafter called recess 16a) and the electrode 17 is at the bottom of the concave part. The electronic component 15 is held by the work holder 20 with its recess 16a side upward. A solder ball 3 of a larger size than the opening size of this recess 16a is mounted on the recess 16a, and by heating the solder ball 3 is fused and bonded to the electrode 17. That is, by mounting the solder ball 3 on the recess 16a, and heating and fusing the solder ball 3, a solder bump 3' is formed on the electrode 17 in the bottom of the recess 16a as shown in FIG. 2(b).

Back to FIG. 1, a suction head 30 is disposed above the solder ball feeder 1, metal paste feeder 4 and work holder 20. The suction head 30 has an elevating mechanism 32, and a suction tool 31 is fitted to the lower end of the elevating mechanism 32. By evacuating and sucking the inside of the suction tool 31 by suction means not shown, the solder ball 3 is attracted in vacuum to the suction hole provided at the lower side of the suction tool 31. The suction head 30 is coupled with a nut 34 through a bracket 33, and a feed screw 35 held by a frame 37 is engaged with the nut 34. The frame 37 is coupled with a Y-axis table 38 driven by a Y-axis motor 39.

Therefore, by controlling X-axis motor 36, Y-axis motor 39 and elevating mechanism 32 by a controller 40, the suction head 30 moves in the X-direction, Y-direction (vertical direction on the sheet of paper in FIG. 1), and Z-direction, including the parts of the solder ball feeder 1, metal paste feeder 4 and work holder 20 within the moving range, thereby sucking the solder ball 3 from the solder ball feeder 1, adhering the metal paste 6 in the metal paste feeder 4 to the lower side of the solder ball 3 being picked up, and mounting this solder ball 3 on the recess 16a of the electronic component 15.

That is, the elevating mechanism 32, nut 34, feed screw 35, X-axis motor 36, frame 37, Y-axis table 38, and Y-axis motor 39 compose suction head moving means. In the mounting motion of the solder ball 3 by this suction head 30, by controlling the suction head moving means by the controller 40, the solder ball 3 is operated as specified. Various action patterns are registered in the controller 40 by a setting device 41.

The mounting apparatus of solder ball is thus constituted, and the mounting method of solder ball is described below while referring to FIG. 3. In FIG. 3(a), the suction head 30 is moved onto the solder ball feeder 1 by the suction head moving means, and it is moved up and down, and the solder ball 3 is picked up by attracting in vacuum to the lower side of the suction tool 31. The configuration of the solder ball suction holes of the suction tool corresponds to the configuration of the recesses 16a on the substrate 16. Then, as shown in FIG. 3(b), the suction head 30 is moved above the metal paste feeder 4.

Next, as shown in FIG. 3(c), by elevating and lowering the solder balls 3 held by the suction tool 31 to the metal paste 6 applied to the bottom of the container 5, the metal paste 6 is adhered to the lower side of the solder balls 3 by transfer (first step). Then the suction head 30 moves above the work holder 20, and, as shown in FIG. 3(d), is positioned at the electronic component 15 held by the holder element 22 of the holding table 21. At this time, the metal paste feeder 4 moves the squeegee unit 8 horizontally, and the metal paste 6 is shaped.

By elevating and lowering action of the suction head 30, as shown in FIG. 3(e), the solder balls 3 coated with the metal paste 6 contact with the substrate 16 of the electronic component 15, and the metal paste 6 is adhered to the top of the recess 16a (second step). In FIG. 3(e), for the sake of simplicity, the metal paste 6 is applied on the surface of the substrate 16, but more specifically it is applied on the recess 16a provided on the substrate 16.

Referring next to FIG. 4 to FIG. 6, the mounting motion of solder balls 3 on the recesses 16a is described. This operation is intended to promote filling with metal paste 6 by the motion of solder balls 3 in order to fill the recesses 16a of a small opening size sufficiently with metal paste 6 which is high in adhesion and difficult to fill in the narrow gaps.

First, the action in FIG. 4 is explained. In FIG. 4(a), the solder ball 3 having its lower side coated with metal paste 6 is held by the suction tool 31, and is positioned on the recess 16a of the substrate 16. Then, by lowering the suction tool 31, as shown in FIG. 4(b), the metal paste 6 adhered to the solder ball 3 is adhered on the top of the recess 16a. Next, as shown in FIG. 4(c), the suction tool 31 is elevated, and the solder ball 3 is separated from the metal paste 6 adhered to the top of the recess 16a. As a result, as shown in FIG. 4(d), the metal paste 6 is raised while partly adhered to the solder ball 3, and the metal paste 6 adhered to the recess 16a is pulled by the solder ball 3, and is collected in the central part of the recess 16a, and soon the portion remaining on the recess 16a and the portion adhered to the solder ball 3 are pulled apart. At this time, the shapes of the separated portions are conical forms with confronting vertices.

When the solder ball 3 is lowered again, as shown in FIG. 4(e), the metal paste 6 adhered to the solder ball 3 is collected on the recess 16a, and further pushes down the metal paste 6 drooping into the recess 16a by flowing property. Thus, the metal paste 6 is pushed into the recess 16a which is filled up sufficiently, and the metal paste 6 is adhered to the electrode 17 in the bottom of the recess 16a. In this state, by releasing the solder ball 3 from vacuum suction by the suction tool 31 and elevating the suction tool 31, as shown in FIG. 4(f), the solder ball 3 is mounted on the recess 16a filled with metal paste 6. That is, FIG. 4 shows the process of at least one stroke (third step) of once moving the solder ball 3 away from the recess 16a and bringing closer again in order to adhere the metal paste 6 to the electrode 17 in the bottom of the recess 16a, and in this example the solder ball 3 is moved only in the vertical direction on the recess 16a. By the vertical moving motion of the solder ball 3, the metal paste 6 adhered on the recess 16a is collected in the center of the recess 16a, and is pushed into the bottom. This operation is performed at least once, and the actual number of times may be determined by trial depending on the properties of the metal paste 6 or shape of the recess 16a. The vertical moving direction of the solder ball 3 may be also oblique above from the recess 16a.

Other example of motion for the same purpose is explained by referring to FIG. 5. In FIG. 5, the process up to FIG. 5(a) and (b) is same as in FIG. 4. Herein, after adhering the metal paste 6 on the recess 16a shown in FIG. 5(b), the solder ball 3 is moved slightly in the horizontal direction. At this time, since the metal paste 6 is already pushed into the recess 16a, a considerable portion is positioned and drooping into the recess 16a as shown in FIG. 5(c).

In this state, when the solder ball 3 is moved horizontally in opposite direction, as shown in FIG. 5(d), the metal paste 6 collected toward the center of the recess 16a by the solder ball 3 pushes down the metal paste 6 already positioned in the recess 16a deeper into the recess 16a. By repeating the action shown in FIG. 5(c) and (d) by a specified number of times, the metal paste 6 is sequentially collected into the recess 16a by the solder ball 3, and, as shown in FIG. 5(e), the metal paste 6 fills up the recess 16a and is adhered on the electrode 17. FIG. 5(f) shows the same state as in FIG. 4(f). That is, FIG. 5 shows the process of at least one stroke (third step) of once moving the solder ball 3 away from the recess 16a in the horizontal direction and bringing closer again in order to adhere the metal paste 6 to the electrode 17 in the bottom of the recess 16a, and this operation includes a motion of moving the solder balls in the horizontal direction.

A different example of motion for the same purpose is explained by referring to FIG. 6. In FIG. 6, the process up to FIG. 6 (a), (b) and (c) is same as in FIG. 4(a) to (d). Thereafter, as shown in FIG. 6(d), the solder ball 3 is lowered after moving horizontally by a slight distance nearly corresponding to the adhering width of the metal paste. As a result, the metal paste 6 is collected into the central direction of the recess 16a by the spherical surface of the lower side of the solder ball 3, and the metal paste 6 already positioned on the recess 16a in FIG. 6(c) is further pushed deep into the recess 16a.

Next, as shown in FIG. 6(e), the solder ball 3 is elevated, and moved horizontally in opposite direction by a same distance, and is lowered again. Thus, the metal paste 6 is further collected into the central direction of the recess 16a, and by repeating this action, the metal paste 6 is adhered to the electrode 17 in the bottom of the recess 16a. FIG. 6(f) shows the state of the recess 16a thus filled with metal paste 6, and FIG. 6(g) shows the state of completion of mounting of solder balls 3. That is, FIG. 6 shows the process of at least one stroke (third step) of once moving the solder ball 3 away from the recess 16a and bringing closer again, and this operation is for moving the solder ball 3 upward, and lowering to a position slightly remote from the center of the recess.

In any motion shown in FIG. 4 to FIG. 6, the metal paste 6 adhered to the top of the recess 16a is effectively pushed into the recess 16a by moving the solder balls 3 as mentioned above, and fills up the recess 16 and is adhered to the electrode 17 in the bottom. The operation of the third step is not limited to the three motions mentioned above, but these motions may be also combined.

Through such process, the electronic component 15 having the solder balls 3 mounted on the recesses 16a is sent to next step. Herein, when heated above the melting point of the solder, the solder ball 3 is fused, and the solder is bonded to the electrode 17 in the bottom of the recess 16a. At this time, since the recess 16a has been sufficiently filled with metal paste 6 in the preceding step and is contacting with the surface of the electrode 17, when bonding with solder, the surface oxide films on the solder ball 3 and electrode 17 are removed, and a favorable solder bonding is realized. When fusing the solder ball 3, by the presence of conductive particles in the metal paste 6 in the recess 16a, the fused solder securely reaches up to the surface of the electrode 17, and a solder junction surface can be formed on the entire surface of the electrode 17, and favorable solder bumps 3' (see FIG. 2(b)) excellent in strength are formed on the electrode 17 in the recess 16a.

Embodiment 2

Figure 7:
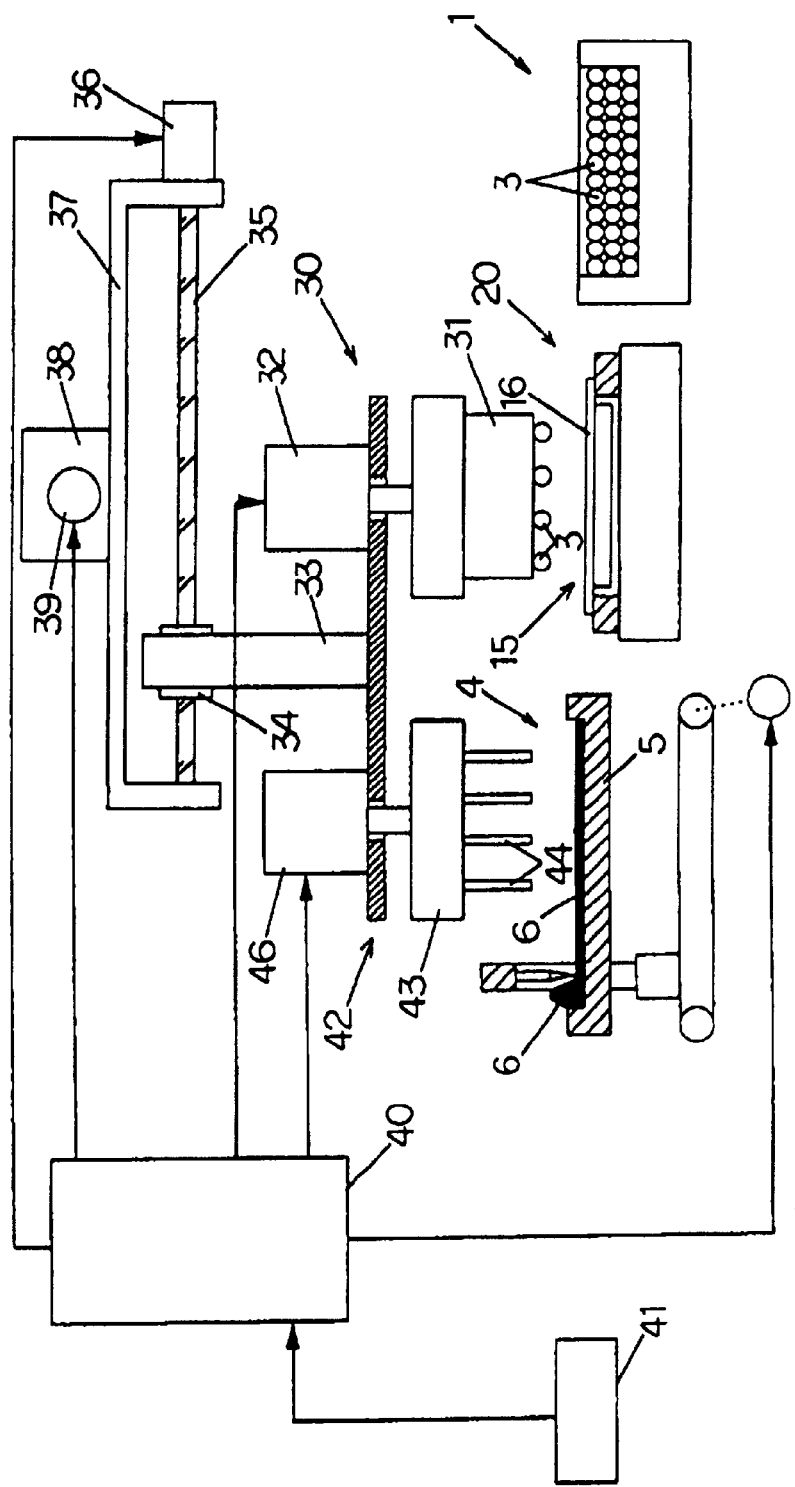
FIG. 7 is a front view of a mounting apparatus of solder ball in embodiment 2 of the invention.
Figure 8:
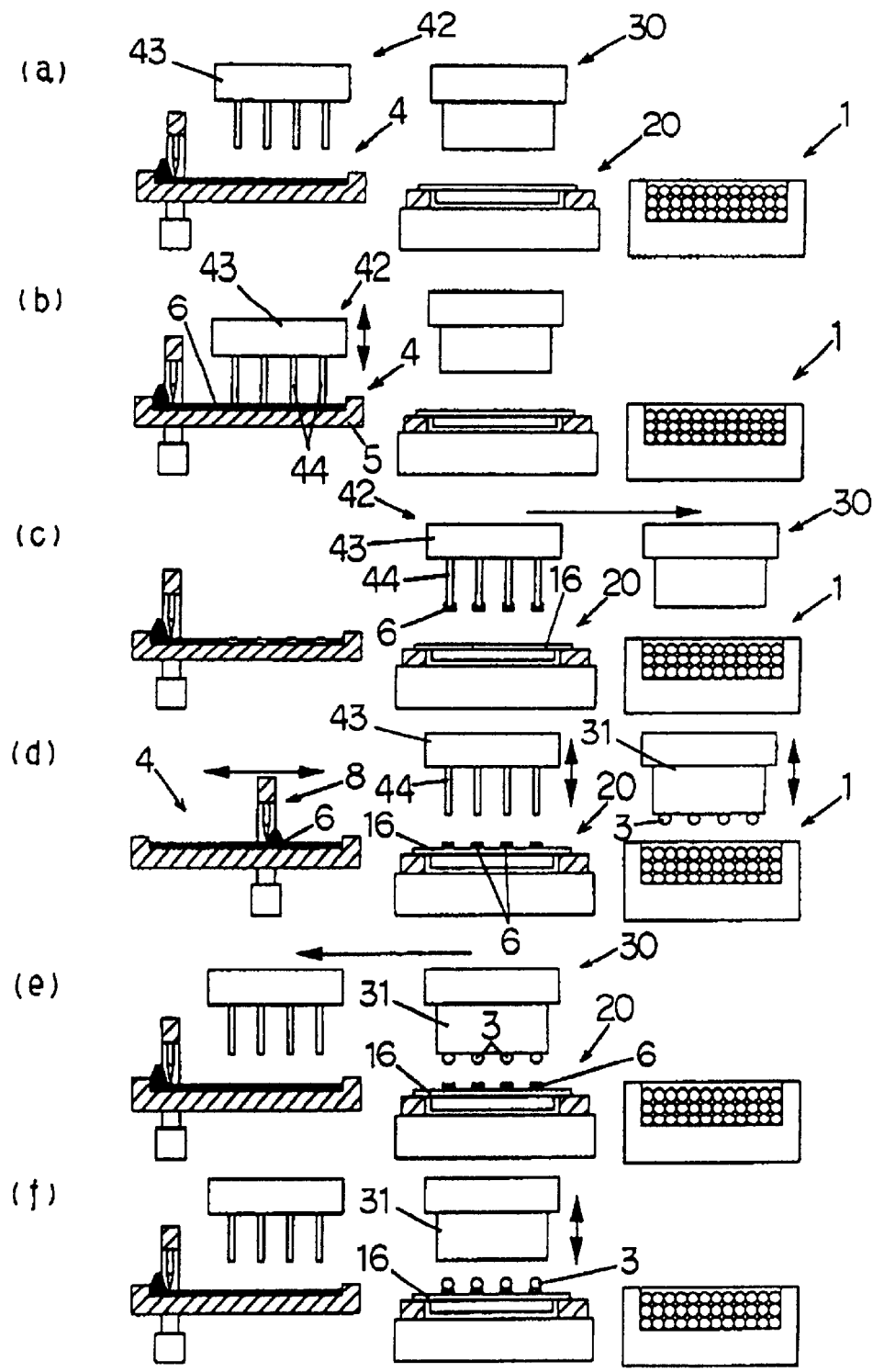
FIGS. 8(a), (b), (c), (d), (e) and (f) are process explanatory diagrams of mounting method of solder ball in embodiment 2 of the invention.
Figure 9:
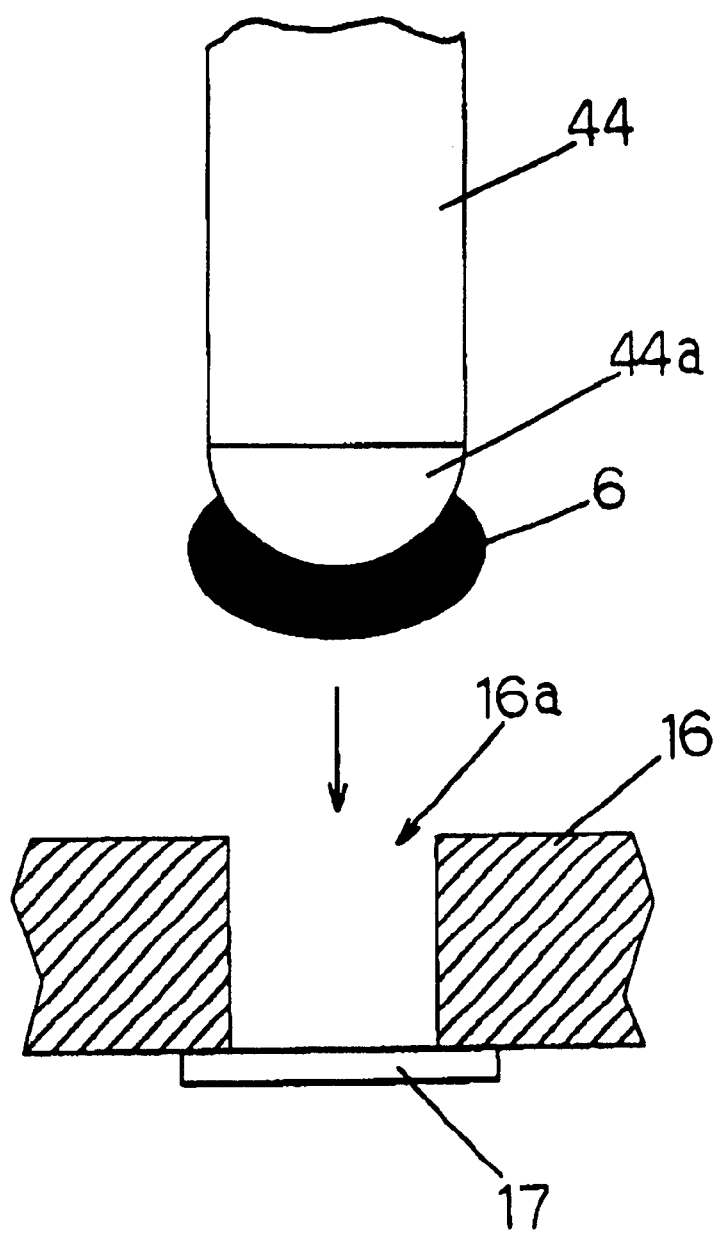
FIG. 9 is a partially magnified view of a transfer pin of a solder ball mounting apparatus in embodiment 2 of the invention.
Figure 10:
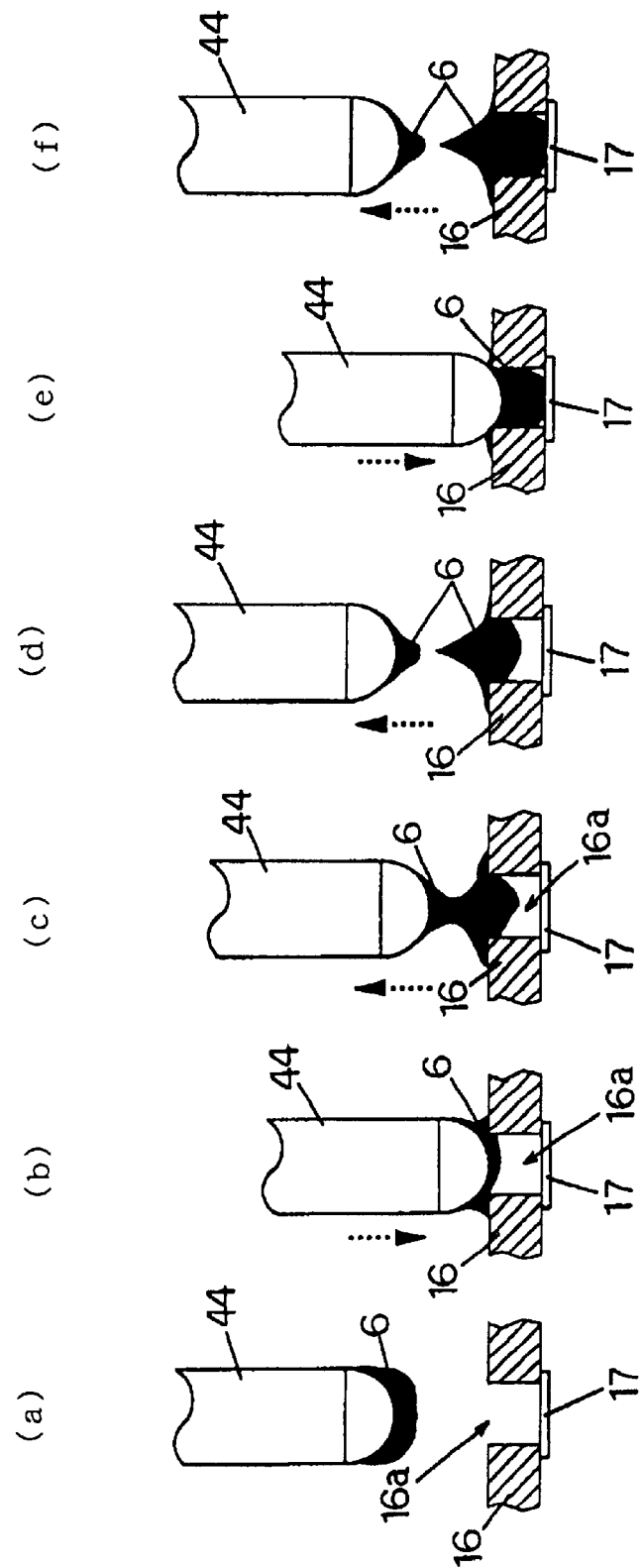
FIGS. 10(a), (b), (c), (d), (e) and (f) are explanatory diagrams of application operation by the transfer pin in embodiment 2 of the invention.
Figure 11:
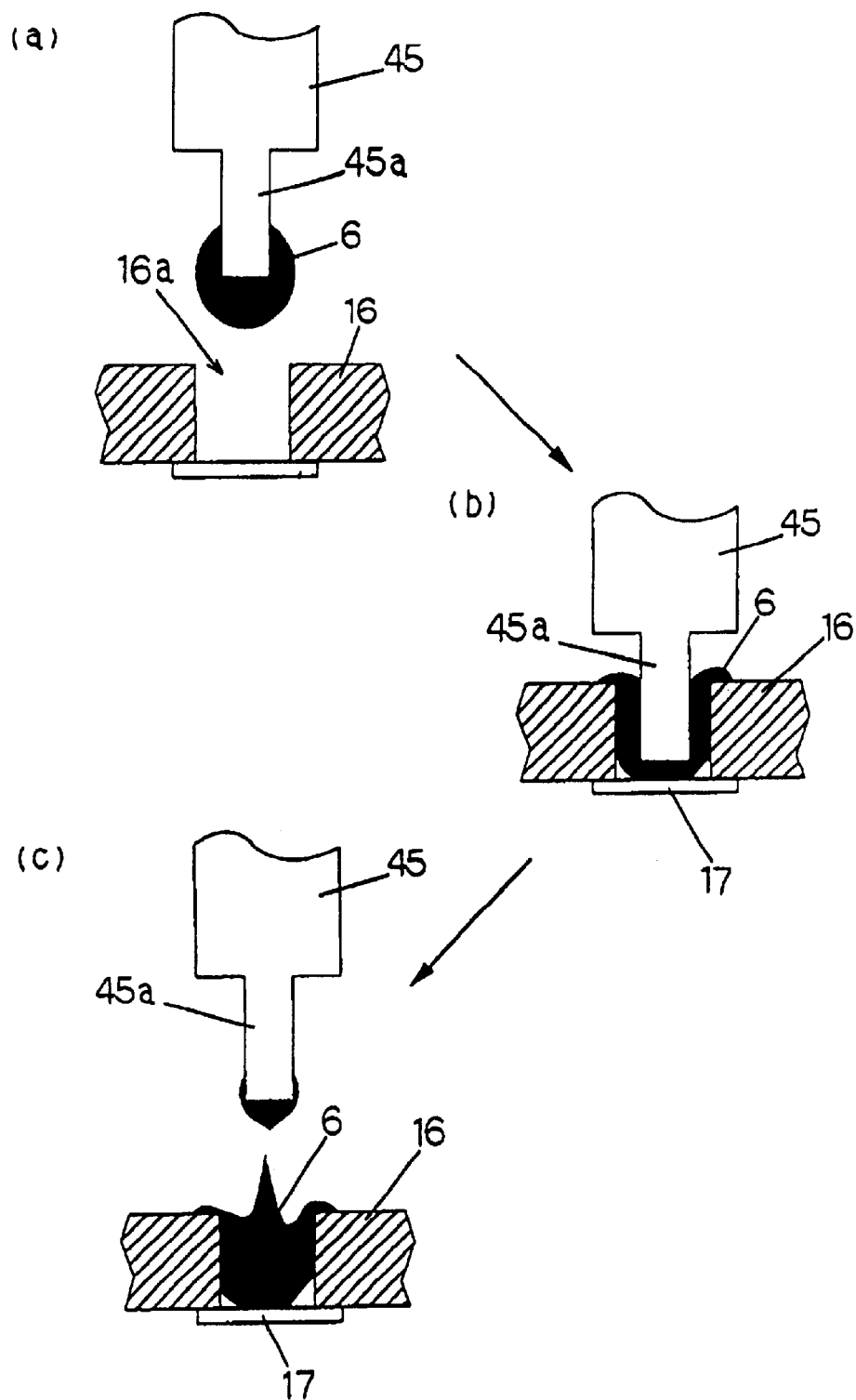
FIGS. 11(a), (b) and (c) are explanatory diagrams of application operation by the transfer pin in embodiment 2 of the invention.

FIG. 7 is a front view of a mounting apparatus of solder ball in embodiment 2 of the invention, FIG. 8(a), (b), (c), (d), (e) and (f) are process explanatory diagrams of mounting method of solder ball, FIG. 9 is a partial magnified view of transfer pin of the solder ball mounting apparatus, and FIG. 10 and FIG. 11 are explanatory diagrams of application operation by the transfer pin.

Referring first to FIG. 7, the mounting apparatus of solder ball is described. In FIG. 7, a work holder 20 is disposed beside a solder ball feeder 1, and a metal paste feeder 4 is disposed beside the work holder 20. The solder ball feeder 1, work holder 20, and metal paste feeder 4 are same as in embodiment 1 shown in FIG. 1. In embodiment 2, however, the work holder 20 is positioned in the middle of the solder ball feeder 1 and the metal paste feeder 4.

Above the solder ball feeder 1, work holder 20 and metal paste feeder 4, same head moving means as in embodiment 1 is provided, and a suction head 30 and a transfer head 42 are attached to a bracket 33 of the head moving means. The suction head 30 and transfer head 42 move integrally in the horizontal direction. Herein, the suction head 30 is same as in embodiment 1. The transfer head 42 comprises a transfer tool 43 having plural transfer pins 44, and an elevating mechanism 46 for elevating and lowering the transfer tool 43.

The elevating mechanism 46, nut 34, feed screw 35, X-axis motor 36, frame 37, Y-axis table 38, and Y-axis motor 39 compose transfer head moving means. By controlling the transfer head moving means by a controller 40, the transfer pins 44 can be operated as specified. With the transfer tool 43 positioned on the metal paste feeder 4, the transfer pins 44 are lowered to contact with the metal paste 6 applied in the container 5, and then by lifting the transfer pins 44, the metal paste 6 is adhered to the lower ends of the transfer pins 44.

The mounting method of solder ball is described below. First, in FIG. 8(a), driving the transfer head moving means, the transfer head 42 is positioned on the metal paste feeder 4. At the same time, the suction head 30 is moved and positioned on the work holder 20. Then, as shown in FIG. 8(b), the transfer tool 43 is lowered until the transfer pins 44 contact with the bottom of the container 5 containing the metal paste 6, and then the transfer tool 43 is lifted. As a result, the metal paste 6 is adhered to the lower ends of the transfer pins 44 by transfer (first step).

Then, as shown in FIG. 8(c), by driving the head moving means, the transfer head 42 is positioned on the work holder 20 and the suction head 30 on the solder ball feeder 1. The transfer pins 44 are positioned in the recesses 16a provided in the substrate 16 of the electronic component 15. Next, as shown in FIG.8(d), the transfer tool 43 is lowered and the metal paste 6 adhered to the lower end of the transfer pin 44 is adhered onto the recess 16a of the substrate 16 (second step). Parallel to this operation, the suction tool 31 moves up and down on the solder ball feeder 1, and as the suction tool 31 sucks by vacuum, the solder balls 3 are picked up by vacuum suction on the lower side of the suction tool 31. At this time, in the metal paste feeder 4, by moving the squeegee unit 8 horizontally, the surface of the metal paste 6 is shaped.

Next, as shown in FIG. 8(e), driving the head moving means again, the suction head 30 is positioned on the work holder 20, and the solder ball 3 held by the suction tool 31 is positioned in the recess 16a coated with the metal paste 6. By lowering the suction tool 31 and releasing the solder ball 3 from the vacuum suction, the solder ball 3 is mounted on the recess 16a coated with the metal paste 6.

Referring next to FIG. 9 and FIG. 10, transfer of metal paste 6 on the recess 16a by using transfer pins 44 is explained. As shown in FIG. 9, the transfer pin 44 has a lower end 44a of a larger size than the opening size of the recess 16a, and the shape of the lower end 44a is nearly spherical. When this lower end 44a contacts with the metal paste 6 applied in the metal paste feeder 4, the metal paste 6 is adhered to the lower end 44a same as in the case of adhering metal paste 6 to the solder ball 3 in embodiment 1.

FIG. 10 explains the operation for filling the recess 16a with metal paste 6 and adhering to the electrode 17 in the bottom of the recess 16a by moving the transfer pins 44, that is, the operation (third step) of once moving the transfer pins 44 away from the recess 16a, and bringing closer again. In the example shown in FIG. 10, the same action applied to the solder balls 3 shown in FIG. 4 in embodiment 1 is applied to the metal paste 6, and FIG. 4 (a) to (f) correspond to FIG. 10(a) to (f).

FIG. 10 shows an example of moving the transfer pins in the vertical direction in the above operation, and corresponding to the operation shown in FIG. 5 and FIG. 6 in embodiment 1, the example including the action of moving the transfer pins 44 in the horizontal direction and the example including the action of moving the transfer pins 44 above and lowering to the position slightly remote from the center of the recess 16a may be also used as the operation for the same purpose. In either example, the same effects as when filling the recesses 16a with the metal paste 6 by using the solder balls 3 in embodiment 1 may be obtained.

Further, as shown in FIG. 11, by using transfer pins 45 having the lower ends 45a of a smaller size than the opening size of the recess 16a, the recess 16a can be sufficiently filled with metal paste 6. That is, as shown in FIG. 11(a), the metal paste 6 is adhered to the lower end 45a of the transfer pin 45, and after positioning in the recess 16a, the transfer pin 45 is lowered as shown in FIG. 11(b), and the lower end 45a is inserted into the recess 16a.

As a result, the metal paste 6 adhered to the transfer pin 45 is pushed into the recess 16a, and is directly adhered to the surface of the electrode 17 in the bottom of the recess 16a by the lower end 45a. Later, by lifting the transfer pin 45, the recess 16a is sufficiently filled with metal paste 6 as shown in FIG. 11(c).

The solder balls 3 are mounted on the recesses 16a thus filled with metal paste 6, and are sent to next step, and heated, and as the solder balls 3 are fused, solder bumps 3' are formed, same as in embodiment 1.

As described herein, as the method of feeding the metal paste 6 on the electrode formed in the bottom of the recess 16a, by transferring by using the solder balls 3 or transfer pins 44, 45, or operating the solder balls 3 or transfer pins 44, 45 for filling up the recesses 16a sufficiently, it is possible to mount the solder balls for forming solder bumps efficiently without requiring any particular step for feeding metal paste into the recesses 16a by using any particular device . Moreover, feeding of metal paste into the recesses 16a is assured, and therefore solder bumps excellent in solder bonding performance and favorable in shape can be formed.

What is claimed is:

1. A solder bump forming method for forming a solder bump on an electrode in a bottom of a recess formed in a workpiece, comprising: adhering a metal paste to the lower side of a solder ball, adhering the metal paste adhered to the solder ball to the top of the recess by positioning the solder ball at the recess, performing at least one cycle of motion of moving the solder ball away from and back toward the recess, and mounting the solder ball on said recess filled with the metal paste and performing heating to use said solder ball.

2. A solder bump forming method of claim 1, wherein said performing of at least one cycle of motion includes a motion of moving the solder ball in the vertical direction relative to the workpiece.

3. A solder bump forming method of claim 1, wherein said performing of at least one cycle of motion includes a motion of moving the solder ball in the horizontal direction relative to the workpiece.

4. A solder bump forming method of claim 1, wherein said performing of at least one cycle of motion includes a motion of moving the solder ball above the workpiece, and then lowering the solder ball to a position slightly remote from the center of said recess.

5. A solder bump forming method for forming a solder bump on an electrode in a bottom of a recess formed in a workpiece, comprising: adhering a metal paste to the lower end of a transfer pin, adhering the metal paste adhered to the transfer pin to the top of the recess by positioning the transfer pin at the recess, performing at least one cycle of motion of moving the transfer pin away from and back toward the recess, mounting a solder ball on the recess filled with the metal paste, and fusing said solder ball.

6. A solder bump forming method of claim 5, wherein said performing of at least one cycle of motion includes a motion of moving the transfer pin in the vertical direction relative to the workpiece.

7. A solder bump forming method of claim 5, wherein said performing of at least one cycle of motion includes a motion of moving the transfer pin in the horizontal direction relative to the workpiece.

8. A solder bump forming method of claim 5, wherein said performing, of at least one cycle of motion includes a motion of moving the transfer pin above the workpiece, and then lowering the transfer pin to a position slightly remote from the center of said recess.

9. A solder ball mounting method, for forming a solder bump on an electrode in a bottom of a recess formed in a workpiece and mounting a solder ball of a larger size than an opening size of the recess on said recess, comprising: applying a metal paste to the lower side of a solder ball, adhering the metal paste adhered to said solder ball to the top of the recess by positioning the solder ball at said recess, and performing at least one cycle of motion of moving said solder ball away from and back toward the recess.

10. A solder ball mounting method of claim 9, wherein said performing of at least one cycle of motion includes a motion of moving the solder ball in the vertical direction relative to the workpiece.

11. A solder ball mounting method of claim 9, wherein said performing of at least one cycle of motion includes a motion of moving the solder ball in the horizontal direction relative to the workpiece.

12. A solder ball mounting method of claim 9, wherein said performing of at least one cycle of motion includes a motion of moving the solder ball above the workpiece, and then lowering the solder ball to a position slightly remote from the center of said recess.

13. A solder ball mounting method, for forming a solder bump on an electrode in a bottom of a recess formed in a workpiece and mounting a solder ball of a larger size than an opening size of the recess on said recess, comprising: adhering a metal paste to the lower side of a transfer pin having a lower end of a larger size than the opening size of said recess, adhering the metal paste adhered to said transfer pin to the top of the recess by positioning said transfer pin at the recess of the workpiece, performing at least one cycle of motion of moving said transfer pin away from and back toward the recess, and mounting the solder ball on said recess filled with the metal paste.

14. A solder ball mounting method of claim 13, wherein said performing of at least one cycle of motion includes a motion of moving said transfer pin in the vertical direction relative to the workpiece.

15. A solder ball mounting method of claim 13, wherein said performing of at least one cycle of motion includes a motion of moving said transfer pin in the horizontal direction relative to the workpiece.

16. A solder ball mounting method of claim 13, wherein said performing of at least one cycle of motion includes a motion of moving said transfer pin above the workpiece, and then lowering the transfer pin to a position slightly remote from the center of said recess.

* * * * *